(12) United States Patent
Lee et al.

(10) Patent No.: US 8,169,583 B2
(45) Date of Patent: May 1, 2012

(54) THIN FILM TRANSISTOR ARRAY PANEL AND LIQUID CRYSTAL DISPLAY HAVING THE SAME

(75) Inventors: Seong-Young Lee, Anyang-si (KR); Seung-Soo Baek, Seoul (KR)

(73) Assignee: Samsung Electronics Co., Ltd. (KR)

( * ) Notice: Subject to any disclaimer, the term of this patent is extended or adjusted under 35 U.S.C. 154(b) by 483 days.

(21) Appl. No.: 12/407,344

(22) Filed: Mar. 19, 2009

(65) Prior Publication Data

US 2010/0020256 A1    Jan. 28, 2010

(30) Foreign Application Priority Data

Jul. 28, 2008  (KR) .................. 10-2008-0073699

(51) Int. Cl.
*G02F 1/1345* (2006.01)
*G02F 1/1333* (2006.01)
(52) U.S. Cl. ........................ 349/149; 349/110
(58) Field of Classification Search ............. 349/38, 349/42, 44, 46, 139, 143
See application file for complete search history.

(56) References Cited

U.S. PATENT DOCUMENTS

| | | | |
|---|---|---|---|
| 7,180,559 B2 * | 2/2007 | Chang et al. | 349/106 |
| 7,456,909 B2 * | 11/2008 | Park | 349/40 |
| 2009/0091671 A1 * | 4/2009 | Tsubata et al. | 349/38 |

FOREIGN PATENT DOCUMENTS

| | | |
|---|---|---|
| JP | 11119207 | 4/1999 |
| JP | 2002156653 | 5/2002 |
| KR | 1020020007037 A | 1/2002 |
| KR | 1020020045256 A | 6/2002 |
| KR | 1020030028955 A | 4/2003 |
| KR | 1020060058466 A | 5/2006 |
| KR | 1020060124141 A | 12/2006 |
| WO | WO2008/010334 A1 * | 1/2008 |

* cited by examiner

*Primary Examiner* — Brian M. Healy
*Assistant Examiner* — Charles Chang
(74) *Attorney, Agent, or Firm* — Cantor Colburn LLP

(57) ABSTRACT

A thin film transistor array panel includes; a substrate including a display area and a peripheral area, a display area signal line disposed in the display area, a display area thin film transistor connected to the display area signal line, a plurality of peripheral area signal lines disposed in the peripheral area, a light-blocking member disposed on the display area signal line, the display area thin film transistor, and the plurality of peripheral area signal lines, a transparent connection electrically connecting the plurality of peripheral area signal lines to each other through a plurality of first contact holes, and a pixel electrode connected to the display area thin film transistor through a second contact hole, wherein an area density of the first contact hole in the peripheral area is less than or equal to about three times an area density of the second contact hole in the display area.

24 Claims, 7 Drawing Sheets

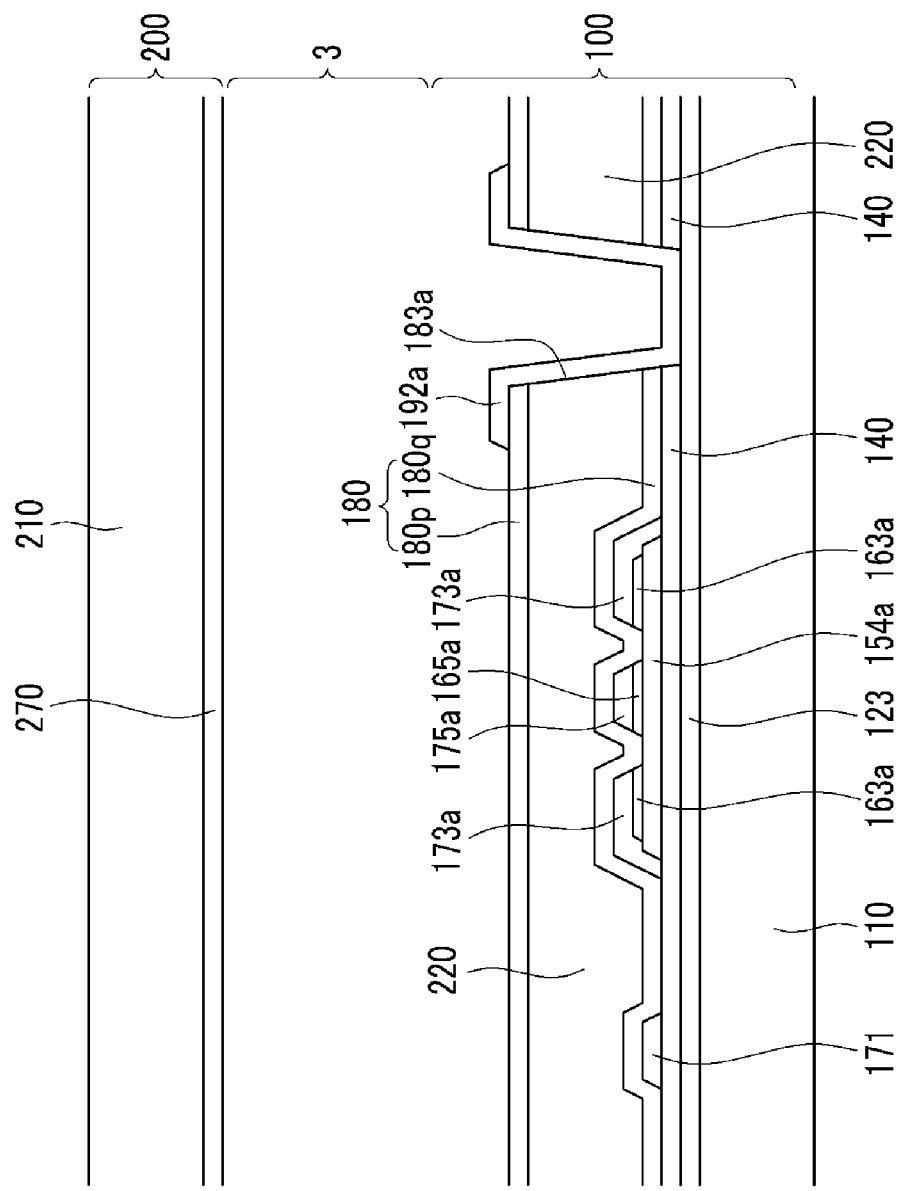

THIN FILM TRANSISTOR ARRAY PANEL AND LIQUID CRYSTAL DISPLAY HAVING THE SAME

This application claims priority to Korean Patent Application No. 10-2008-0073699, filed on Jul. 28, 2008, and all the benefits accruing therefrom under 35 U.S.C. §119, the contents of which in its entirety are herein incorporated by reference.

BACKGROUND OF THE INVENTION (a) Technical Field

The present invention relates to a thin film transistor array panel and a liquid crystal display including the same.

(b) Discussion of the Related Art

A liquid crystal display ("LCD") is one type of flat panel display among the various flat panel displays that are now widely used. An LCD typically includes two display panels on which field generating electrodes such as pixel electrodes and a common electrode are formed, and a liquid crystal layer interposed between the display panels. In the LCD, a voltage is applied to the field generating electrodes to generate an electric field in the liquid crystal layer, which determines the orientation of liquid crystal molecules of the liquid crystal layer, and thereby also controlling the polarization of light passing therethrough, and an image is displayed by controlling the transmission of light through the liquid crystal layer.

In the process in which a light-blocking member is formed on the lower panel including a thin film transistor and a transparent electrode is formed on the light-blocking member, the light-blocking member does not cover a contact hole formed between the opaque electrode, such as those in the thin film transistor, and the transparent electrode. Light is then reflected by the contact hole, thereby deteriorating the display quality of the LCD.

BRIEF SUMMARY OF THE INVENTION

An exemplary embodiment of a thin film transistor array panel according to the present invention includes; a substrate including a display area and a peripheral area, a display area signal line disposed in the display area of the substrate, a display area thin film transistor disposed in the display area and connected to the display area signal line, a plurality of peripheral area signal lines disposed in the peripheral area of the substrate, a light-blocking member disposed on the display area signal line, the display area thin film transistor, and the plurality of peripheral area signal lines, a transparent connection electrically connecting the plurality of peripheral area signal lines to each other through a plurality of first contact holes penetrating the light-blocking member, and a pixel electrode connected to the display area thin film transistor through a second contact hole penetrating the light-blocking member, wherein the area density of the first contact hole in the peripheral area is equal to or less than about three times the area density of the second contact hole in the display area.

In one exemplary embodiment, the pixel electrode may be disposed on the light-blocking member.

In one exemplary embodiment, the thin film transistor array panel may further include a peripheral area thin film transistor disposed in the peripheral area of the substrate, wherein the plurality of first contact holes may include a contact hole electrically connecting the peripheral area thin film transistor and at least one of the peripheral area signal lines to each other.

In one exemplary embodiment, the peripheral area thin film transistor may include a source electrode and a gate electrode, and the plurality of first contact holes may include a contact hole for electrically connecting the source electrode and the gate electrode of the peripheral area thin film transistor.

In one exemplary embodiment, the plurality of peripheral area signal lines may include; a storage electrode line disposed on the substrate and a storage voltage supplying line disposed on the storage electrode line, wherein the plurality of first contact holes may include a contact hole electrically connecting the storage electrode line and the storage voltage supplying line.

In one exemplary embodiment, the plurality of peripheral area signal lines may include; a gate line layer signal line of a gate driver disposed on the substrate and a data line layer signal line of the gate driver disposed on the substrate, wherein the plurality of first contact holes may include a contact hole electrically connecting the gate line layer signal line and the data line layer signal line.

In one exemplary embodiment, he thin film transistor array panel may further include a passivation layer disposed on the display area thin film transistor, wherein the second contact hole may penetrate the passivation layer.

Another exemplary embodiment of a thin film transistor array panel according to the present invention includes; a substrate including a display area and a peripheral area, a display area signal line disposed in the display area of the substrate, a display area thin film transistor disposed in the display area and connected to the display area signal line, a peripheral area signal line disposed in the peripheral area of the substrate, a peripheral area thin film transistor disposed in the peripheral area of the substrate, a light-blocking member disposed on the display area signal line, the display area thin film transistor, the peripheral area thin film transistor, and the peripheral area signal line, a transparent connection electrically connecting the peripheral area signal line to the peripheral area thin film transistor through a first contact hole penetrating the light-blocking member, and a pixel electrode connected to the display area thin film transistor through a second contact hole penetrating the light-blocking member, wherein the area density of the first contact hole in the peripheral area is equal to or less than about three times the area density of the second contact hole in the display area.

Another exemplary embodiment of a thin film transistor array panel according to the present invention includes; a substrate including a display area and a peripheral area, a display area signal line disposed in the display area of the substrate, a display area thin film transistor disposed in the display area and connected to the display area signal line, a storage electrode line disposed in the peripheral area of the substrate, a storage voltage supplying line disposed in the peripheral area of the substrate and disposed on the storage electrode line, a light-blocking member disposed on the display area signal line, the display area thin film transistor, the storage electrode line, and the storage voltage supplying line, a transparent connection electrically connecting the storage electrode line to the storage voltage supplying line through a first contact hole penetrating the light-blocking member, and a pixel electrode connected to the display area thin film transistor through a second contact hole penetrating the light-blocking member, wherein the area density of the first contact hole in the peripheral area is equal to or less than about three times the area density of the second contact hole in the display area.

Another exemplary embodiment of a thin film transistor array panel according to the present invention includes; a substrate including a display area and a peripheral area, a display area signal line disposed in the display area of the substrate, a display area thin film transistor disposed in the display area and connected to the display area signal line, a gate driver disposed in the peripheral area of the substrate, a gate line layer signal line and a data line layer signal line included to the gate driver, a light-blocking member disposed on the display area signal line, the display area thin film transistor, the gate line layer signal line, and the data line layer signal line, a transparent connection electrically connecting the gate line layer signal line to the data line layer signal line through a first contact hole penetrating the light-blocking member, and a pixel electrode connected to the display area thin film transistor through a second contact hole penetrating the light-blocking member, wherein the area density of the first contact hole in the peripheral area is equal to or less than about three times the area density of the second contact hole in the display area.

An exemplary embodiment of a liquid crystal display ("LCD") according to the present invention includes; a first display panel including; a first substrate including a display area and a peripheral area, a display area thin film transistor disposed in the display area of the first substrate, a peripheral area signal line disposed in the peripheral area of the first substrate, a peripheral area thin film transistor disposed in the peripheral area, and a light-blocking member disposed on the display area thin film transistor, the peripheral area thin film transistor, and the peripheral area signal line, a second display panel including; a second substrate facing the first substrate, and a common electrode disposed on the second substrate, and a liquid crystal layer disposed between the first display panel and the second display panel, and further including a transparent connection electrically connecting the peripheral area signal line to the peripheral area thin film transistor through a first contact hole penetrating the light-blocking member, and a pixel electrode connected to the display area thin film transistor through a second contact hole penetrating the light-blocking member, wherein the area density of the first contact hole in the peripheral area is equal to or less than about three times the area density of the second contact hole in the display area.

Another exemplary embodiment of an LCD according to the present invention includes; a first display panel including; a first substrate including a display area and a peripheral area, a display area thin film transistor disposed in the display area of the first substrate, a storage electrode line disposed in the peripheral area of the first substrate, a storage voltage supplying line disposed in the peripheral area and disposed on the storage electrode line, and a light-blocking member disposed on the display area thin film transistor, the storage electrode line, and the storage voltage supplying line, a second display panel including a second substrate facing the first substrate, and a common electrode disposed on the second substrate, and a liquid crystal layer disposed between the first display panel and the second display panel, and further including a transparent connection electrically connecting the storage electrode line to the storage voltage supplying line through a first contact hole penetrating the light-blocking member, and a pixel electrode connected to the display area thin film transistor through a second contact hole penetrating the light-blocking member, wherein the area density of the first contact hole in the peripheral area is less than or equal to about three times the area density of the second contact hole in the display area.

Another exemplary embodiment of an LCD according to the present invention includes; a first display panel including a first substrate having a display area and a peripheral area, a display area thin film transistor disposed in the display area of the first substrate, a gate driver disposed in the peripheral area of the substrate, a gate line layer signal line and a data line layer signal line included to the gate driver, and a light-blocking member disposed on the display area signal line, the display area thin film transistor, the gate line layer signal line, and the data line layer signal line, a second display panel including; a second substrate facing the first substrate, and a common electrode disposed on the second substrate, and a liquid crystal layer disposed between the first display panel and the second display panel, and further including a transparent connection electrically connecting the gate line layer signal line to the data line layer signal line through a first contact hole penetrating the light-blocking member, and a pixel electrode connected to the display area thin film transistor through a second contact hole penetrating the light-blocking member, wherein the area density of the first contact hole in the peripheral area is equal to or less than about three times the area density of the second contact hole in the display area.

According to an exemplary embodiment of the present invention, the ratio of the area of the contact hole disposed in the light-blocking member in the peripheral area for the peripheral area is small such that the reflection of the external light through the contact hole is reduced, thereby improving the display quality of the LCD.

In an exemplary embodiment of the present invention, the light-blocking member is disposed on the thin film transistor array panel such that the transmittance of the LCD is improved and the manufacturing process is simplified.

In an exemplary embodiment of the present invention, the color filter is disposed on the thin film transistor array panel such that the manufacturing process is simplified.

BRIEF DESCRIPTION OF THE DRAWINGS

FIG. 7 is a cross-sectional view of the B region shown in FIG. 5 taken along line VII-VII.

DETAILED DESCRIPTION OF THE INVENTION

Figure 1:
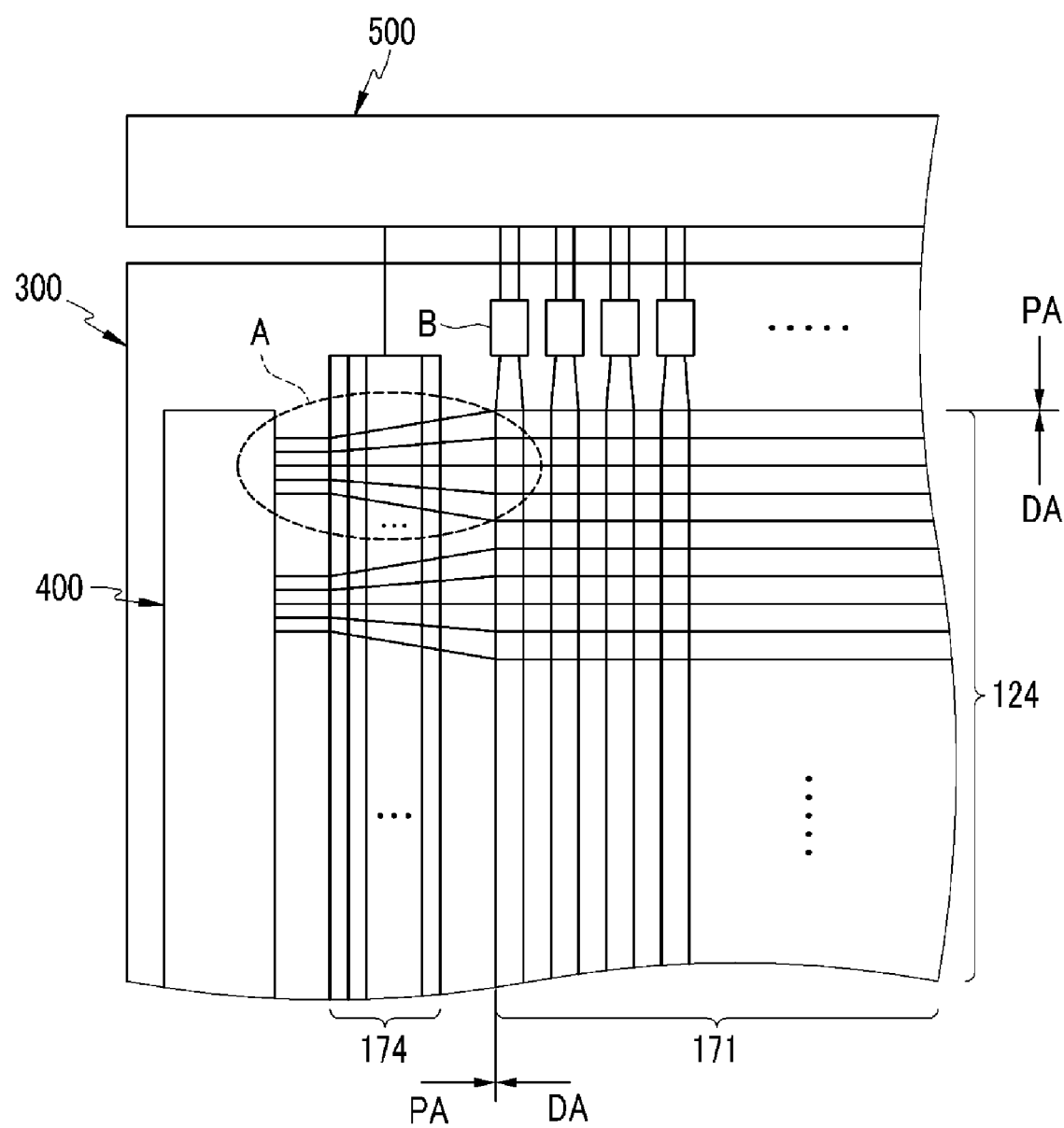
FIG. 1 is a top plan layout view of an exemplary embodiment of a liquid crystal display ("LCD") according to the present invention.

The invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may also be present. In contrast, when an element is referred to as being "directly on"

another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

Hereinafter, the present invention will be described in detail with reference to the accompanying drawings.

Now, an exemplary embodiment of a thin film transistor ("TFT") array panel according to the present invention and a liquid crystal display ("LCD") including the same will be described with reference to FIG. 1 to FIG. 7.

Figure 2:
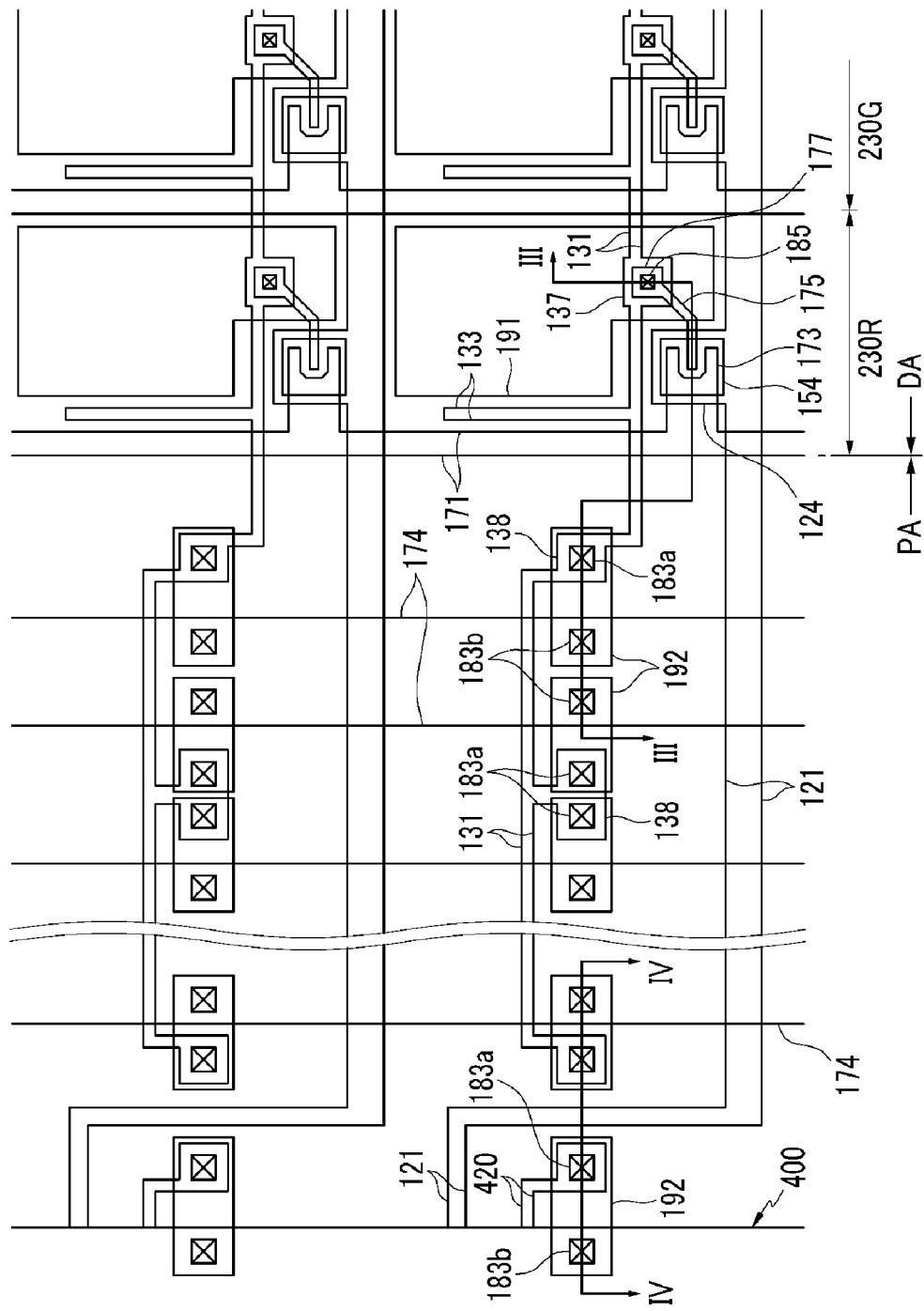
FIG. 2 is a top plan layout view showing an A region shown in FIG. 1.
Figure 3:
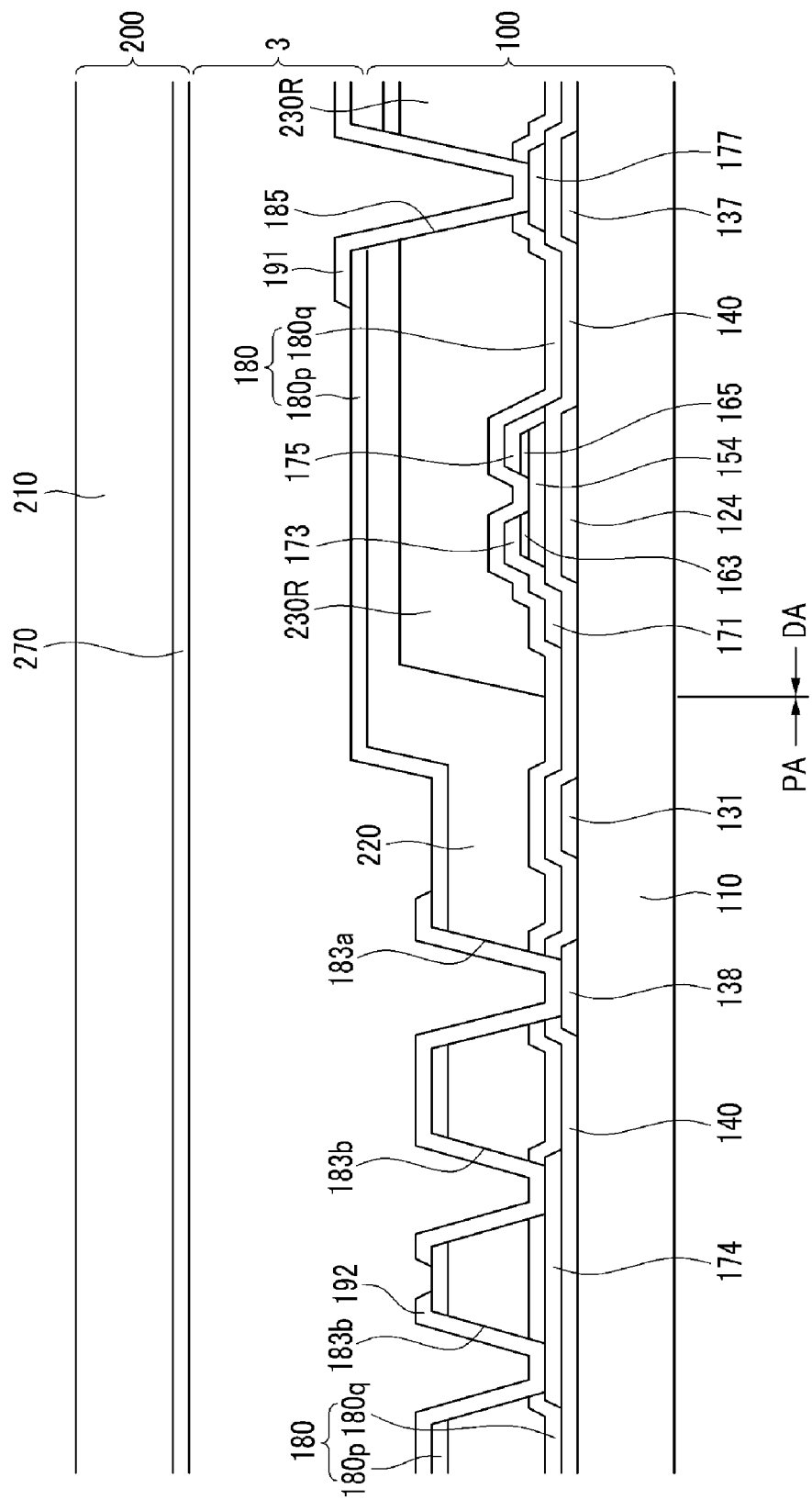
FIG. 3 is a cross-sectional view of the A region shown in FIG. 2 taken along line III-III.
Figure 4:
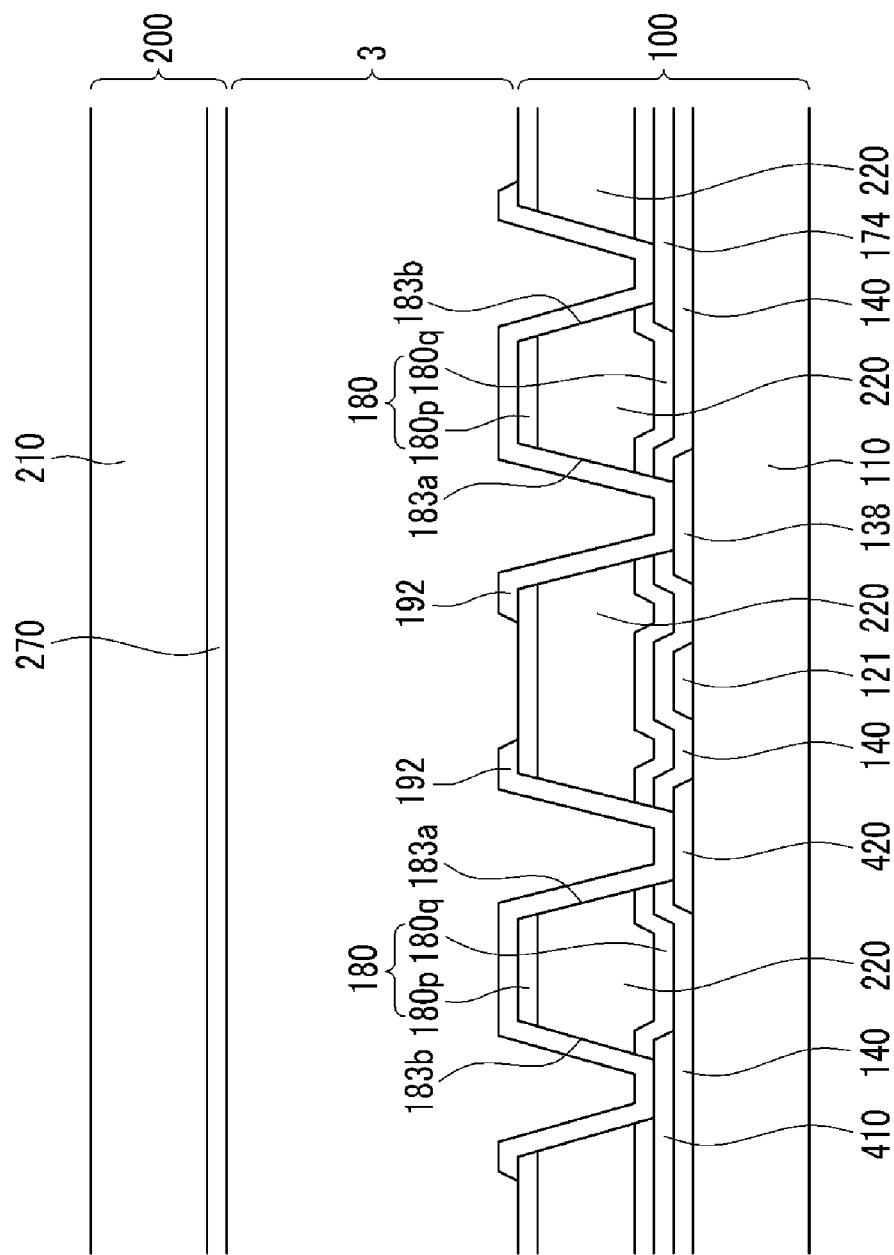
FIG. 4 is a cross-sectional view of the A region shown in FIG. 2 taken along line IV-IV.
Figure 5:
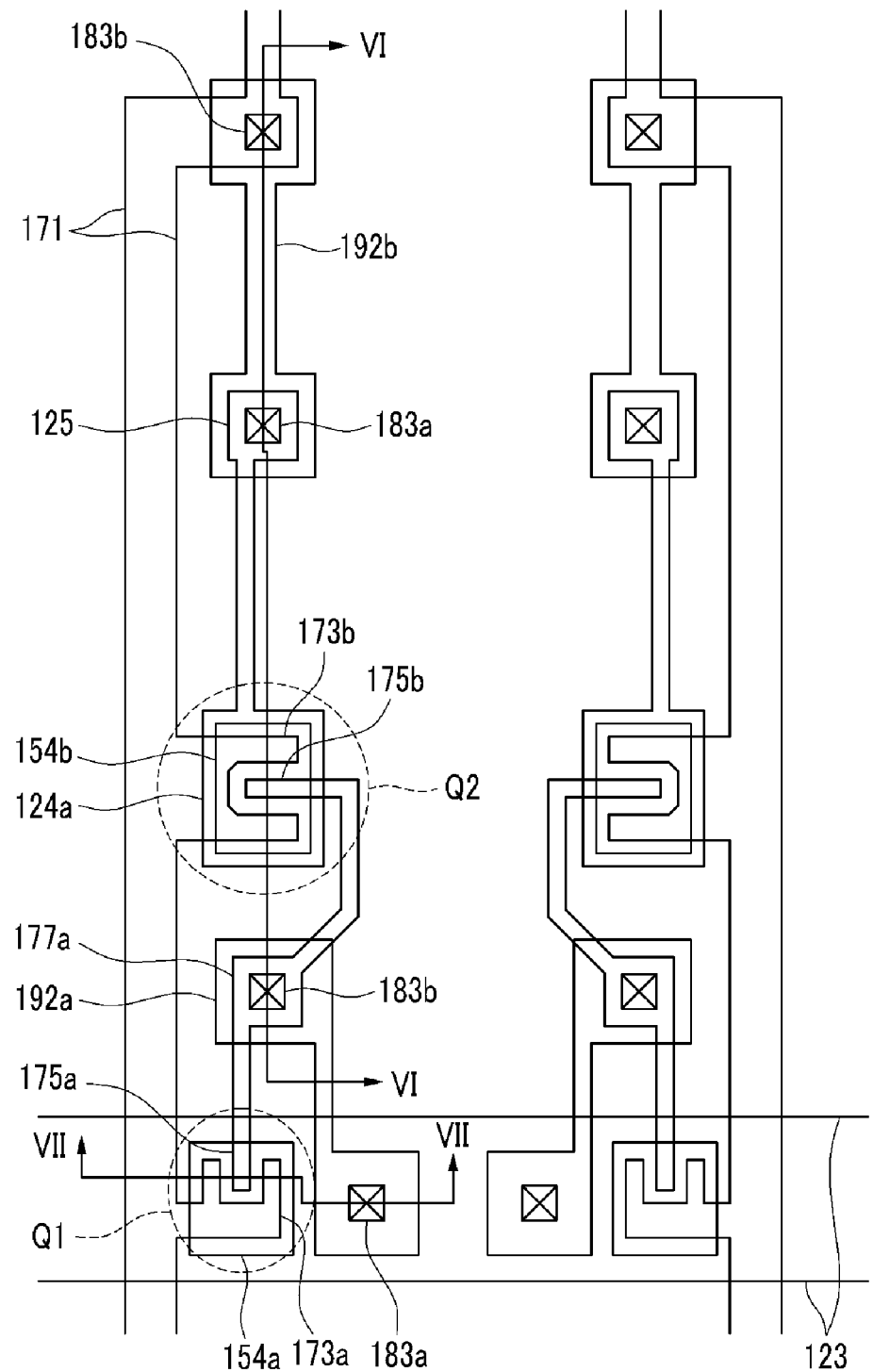
FIG. 5 is a top plan layout view showing a B region shown in FIG. 1.
Figure 6:
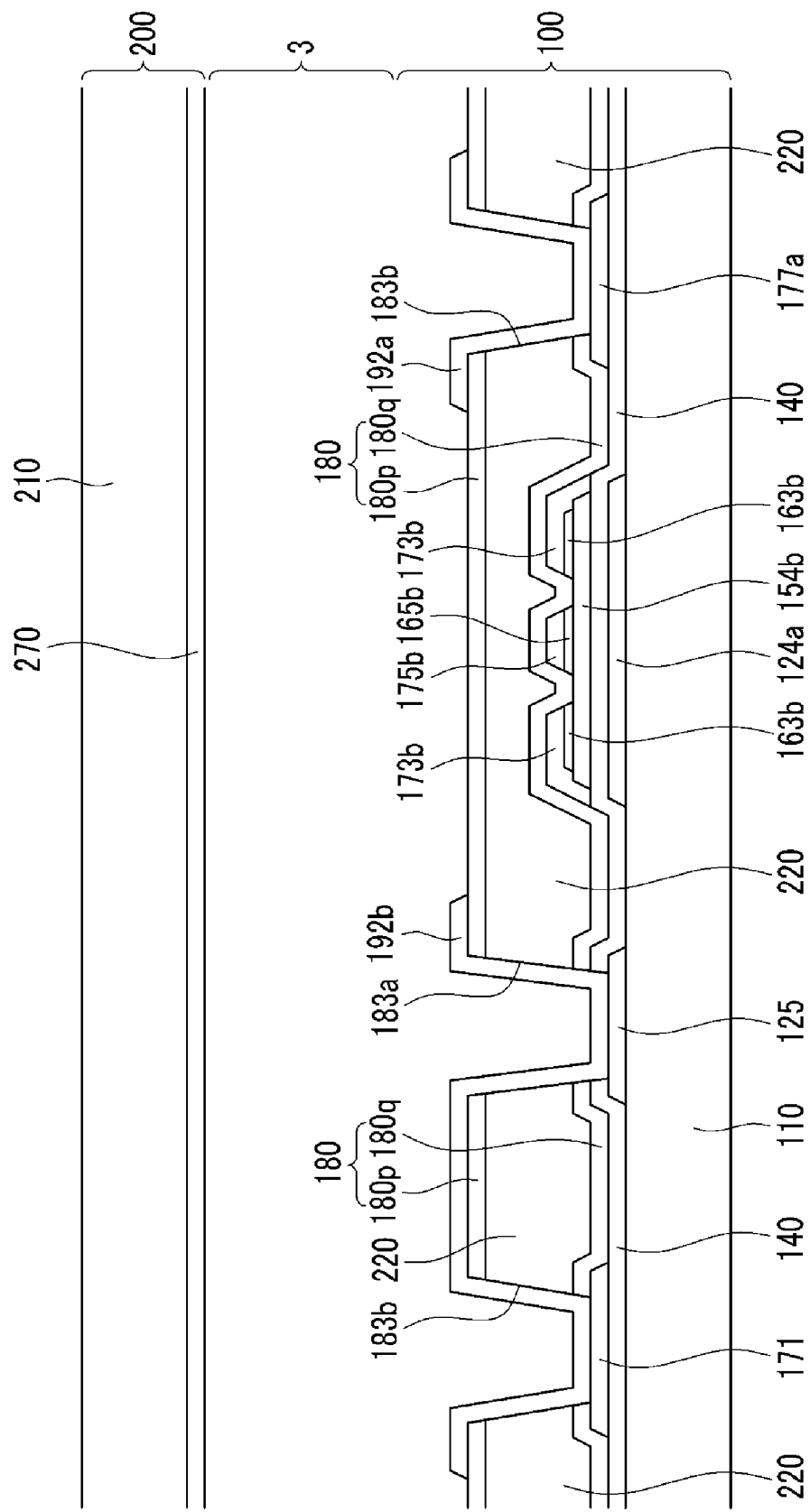
FIG. 6 is a cross-sectional view of the B region shown in FIG. 5 taken along line VI-VI.

FIG. 1 is a top plan layout view of an exemplary embodiment of an LCD according to the present invention, FIG. 2 is a top plan layout view showing an A region of FIG. 1, FIG. 3 is a cross-sectional view of the A region shown in FIG. 2 taken along line III-III, FIG. 4 is a cross-sectional view of the A region shown in FIG. 2 taken along line IV-IV, FIG. 5 is a top plan layout view showing a B region shown in FIG. 1, FIG. 6 is a cross-sectional view of the B region shown in FIG. 5 taken along line VI-VI, and FIG. 7 is a cross-sectional view of the B region shown in FIG. 5 taken along line VII-VII.

An exemplary embodiment of an LCD according to the present invention includes a liquid crystal panel assembly 300, a gate driver 400 and a data driver 500 connected thereto, a gray voltage generator (not shown) connected to the data driver 500, a light source unit (not shown) for providing light to the liquid crystal panel assembly 300, a light source driver (not shown) for controlling the light source unit (not shown), and a signal controller (not shown) for controlling the above.

As shown in FIGS. 1-3, the liquid crystal panel assembly 300 includes a first display panel 100 and a second display panel 200, and a liquid crystal layer 3 interposed therebetween, as shown in FIG. 3, and includes a plurality of gate lines 121 extending in the row direction, a plurality of data lines 171 extending in the column direction, and a plurality of pixels connected to the gate lines 121 and the data lines 171 and approximately arranged in a matrix format, as shown in FIGS. 1 and 2.

In one exemplary embodiment, the liquid crystal layer 3 may have positive or negative dielectric anisotropy, and the liquid crystal molecules of the liquid crystal layer 3 are aligned such that the long axis of the liquid crystal molecules may be arranged parallel or perpendicular to the surface of the display panels 100 and 200 when the electric field is not applied.

At least one alignment layer (not shown) may be formed on an inner surface of the display panels 100 and 200, and, in one exemplary embodiment, may be a horizontal alignment layer. A polarizer (not shown) may be provided on the outer surface of either, or both, of the display panels 100 and 200.

Firstly, the first display panel 100 will be described. The first display panel 100 may further include a thin film transistor ("TFT") formed on the inner surface of a first substrate 110.

A plurality of gate lines 121 and a plurality of storage electrode lines 131 are formed on the first insulating substrate 110. Exemplary embodiments of the insulating substrate 110 may be made of a material such as transparent glass or plastic or other materials with similar characteristics.

The gate lines 121 transmit gate signals and extend in a substantially transverse direction. Each of the gate lines 121 includes a plurality of gate electrodes 124 protruding upward therefrom in a direction substantially perpendicular to the transverse direction.

The storage electrode lines 131 receive a predetermined voltage and are disposed substantially parallel to the gate lines 121. The storage electrode lines 131 are disposed adjacent to the gate lines 121. In one exemplary embodiment the storage electrode lines 131 and the gate lines 121 are both disposed directly on the insulating substrate 110. The storage electrode lines 131 include a primary storage electrode 137, which in one exemplary embodiment has an approximately square shape, and a secondary storage electrode 133. However, the shape and arrangement of the storage electrode lines 131 may be variously changed as would be apparent to one of ordinary skill in the art.

A gate insulating layer 140, exemplary embodiments of which may be made of silicon nitride ("SiNx"), silicon dioxide ("SiOx"), or other similar materials, is formed on the gate lines 121 and the storage electrode lines 131.

A plurality of semiconductor islands 154, exemplary embodiments of which may be made of hydrogenated amorphous silicon (referred to as a-Si) or a crystallized silicon, are formed on the gate insulating layer 140. The semiconductor islands 154 are respectively disposed on the gate electrodes 124.

A pair of ohmic contact islands 163 and 165 are formed on each semiconductor 154. In one exemplary embodiment, the ohmic contacts 163 and 165 are made of n+ hydrogenated a-Si heavily doped with an N-type impurity such as phosphorous. Alternative exemplary embodiments include configurations wherein they may be made of a silicide material.

A plurality of data lines 171 and a plurality of drain electrodes 175 are formed on the ohmic contacts 163 and 165 and the gate insulating layer 140. The data lines 171 transmit data voltages and extend in a longitudinal direction, thereby running substantially perpendicular to the gate lines 121. The data lines 171 are disposed substantially parallel to the second storage electrode 133, and are formed relatively close to the gate electrodes 124. Each of the data lines 171 includes a plurality of source electrodes 173 formed above the gate electrodes 124. In one exemplary embodiment the source electrodes may be formed with a pair of bifurcated branches surrounding the drain electrode 175, e.g., the source electrodes 173 may be formed with a "U" shape on the gate electrodes 124.

The drain electrodes 175 are separated from the data lines 171, and include a narrow portion and a wide portion 177. The narrow portion includes an end portion enclosed by the source electrode 173, and the wide portion 177 overlaps the primary storage electrode 137. In one exemplary embodiment the wide portion 177 has a square shape. In one exemplary embodiment, the wide portion 177 of the drain electrode 175 has the substantially the same area as the primary storage electrode 137. Exemplary embodiments also include configurations wherein the wide portion 177 has less surface area than the primary storage electrode 137.

A gate electrode 124, a source electrode 173, and a drain electrode 175, along with a semiconductor island 154, form a TFT and the channel of the TFT is formed in the semiconductor island 154 between the source electrode 173 and the drain electrode 175.

The ohmic contacts 163 and 165 are interposed between the underlying semiconductor islands 154 and the overlying source electrodes 173 extending from the data lines 171 and the drain electrodes 175 formed thereon, and reduce contact resistance therebetween. The semiconductor islands 154 include exposed portions that are not covered by the source electrodes 173 and the drain electrodes 175, and portions that are disposed between the data lines 171 and the drain electrodes 175.

A passivation layer 180 is formed on the data lines 171, the drain electrodes 175, and the exposed semiconductor islands 154. In the present exemplary embodiment, the passivation layer 180 includes a lower layer 180$q$ made of an inorganic insulator, exemplary embodiments of which include silicon nitride, silicon oxide and other materials with similar characteristics, and an upper layer 180$p$. In one exemplary embodiment the upper layer 180$p$ may include an organic insulator. Alternative exemplary embodiments include configurations wherein at least one of the lower layer 180$q$ and the upper layer 180$p$ may be omitted. The passivation layer 180 has a second contact hole 185 exposing the wide portion 177 of the drain electrode 175.

A light-blocking member 220 is formed between the upper layer 180$p$ and the lower layer 180$q$ of the passivation layer. The light-blocking member 220 prevents the light from being transmitted through the region where the liquid crystal molecules of the liquid crystal layer 3 are not controlled or the external light from being reflected. The light-blocking member 220 may be formed near the TFT and the wide portion 177 of the drain electrode 175, and the second contact hole 185 is passed through the light-blocking member 220 in this case. Here, the light-blocking member 220 is not formed on the second display panel 200, but is formed on the first display panel 100 such that the transmittance of the LCD may be improved and the manufacturing process may be simplified.

A red color filter 230R, a green color filter 230G, and a blue color filter 230B (not shown) are formed between the upper layer 180$p$ and the lower layer 180$q$. In the present exemplary embodiment, the red color filter 230R occupies the region between neighboring data lines 171. In such an exemplary embodiment, the left and right boundaries of the red color filter 230R are disposed on the data lines 171, and may extend according to the data lines 171 in the longitudinal direction, and the red color filter 230R may have a band shape. Alternative exemplary embodiments include configurations wherein the color filters 230R, 230G and 230B are formed in other configurations besides the band shape, e.g., a zigzagging pattern, etc. The red color filter 230R has the second contact hole 185 disposed on the wide portion 177 of the drain electrode 175. In one exemplary embodiment the color filters 230R, 230G and 230B may be made of a photosensitive organic material including pigments. Alternative exemplary embodiments include configurations wherein the color filters 230R, 230G and 230B may be formed on the second display panel 200 rather than the first display panel 100. In such an alternative exemplary embodiment, the second contact hole 185 is only formed in the upper layer 180$p$ or the lower layer 180$q$. The above description of the red color filter 230R may be substantially applied to the green color filter 230G and the blue color filter 230B (not shown).

A plurality of pixel electrodes 191 and contact assistants (not shown) are formed on the upper layer 180$p$ of the passivation layer 180. Exemplary embodiments of the pixel electrodes 191 may be made of a transparent conductive material such as ITO, IZO or other materials having similar characteristics, or a reflective metal, exemplary embodiments of which include aluminum, silver, chromium, other materials with similar characteristics or alloys thereof.

The pixel electrodes 191 are connected to the drain electrodes 175 of the TFTs through the second contact holes 185, and are applied with data voltages from the drain electrodes 175. Each pixel electrode 191 supplied with the data voltages generates an electric field along with the common electrode 270 of the second display panel 200, which determines the orientations of the liquid crystal molecules of the liquid crystal layer 3 disposed between the pixel electrode 191 and the common electrode 270. Accordingly, the light transmittance through the liquid crystal layer 3 differs depending on the determined orientation of the liquid crystal molecules.

The pixel electrode 191 and the common electrode 270 form the liquid crystal capacitor and maintain the voltage applied to the pixel electrode after the TFT is turned off.

The pixel electrode 191 and the drain electrode 175 connected thereto, and the storage electrode line 131 including the primary storage electrode 137 and the second storage electrode 133, are overlapped with each other to thereby form the storage capacitor.

A column spacer (not shown), exemplary embodiments of which may be made of an organic material, maintains the interval between the two display panels 100 and 200.

A display area DA of the LCD is a region where the images are actually output. A peripheral area PA of the LCD is outside of the display area DA, it may include a portion that may be colored, usually, black, and interposed between the display area and a mold frame of the LCD. That is, this portion may be seen as a plurality of black pixel areas, but not actual display images. The peripheral area PA is covered by the light-blocking member 220. In the present exemplary embodiment, the light-blocking member 220 is disposed between the upper layer 180p and the lower layer 180q. However, as described above, alternative exemplary embodiments include configurations wherein the upper layer 180p may be omitted.

Referring to FIG. 2 to FIG. 4, the storage electrode line 131 is extended substantially in the row direction on at least the left portion of the peripheral area PA of the LCD and is disposed at substantially the same layer as the gate line 121, e.g., both the storage electrode 131 and the gate line 121 are formed the same distance from the insulating substrate 110. In one exemplary embodiment, the storage electrode line 131 extends in a row direction on the left and right portions of the peripheral area PA of the LCD. The storage electrode line 131 includes a plurality of outer storage electrodes 138. Exemplary embodiments of the outer storage electrode 138 may have an approximately square or rectangular shape.

A storage voltage supplying line 174 extends substantially in the column direction on at least the left portion of the peripheral area PA of the LCD and is disposed at substantially the same layer as the data line 121, e.g., both the storage voltage supplying line 174 and the data line 121 are formed the same distance from the insulating substrate 110.

A transparent connection 192 electrically connects the storage voltage supplying line 174 and the outer storage electrode 138. A first contact hole 183a is formed on the connection portion between the transparent connection 192 and the outer storage electrode 138, and an additional first contact hole 183b is formed on the connection portion between the transparent connection 192 and the storage voltage supplying line 174. However, alternative exemplary embodiments include configurations wherein the outer storage electrode 138 and the storage voltage supplying line 174 may be omitted.

In one exemplary embodiment, the gate driver 400 connected to the gate lines 121 is formed on the left and right portions of the peripheral area PA of the LCD. Alternative exemplary embodiments include configurations wherein the gate driver 400 is formed only to one side of the peripheral area PA. The gate driver 400 includes a data line layer signal line 410 and a gate line layer signal line 420, which are electrically connected through the transparent connection 192. The data line layer signal line 410 is disposed at substantially the same layer as the data line 171, and the gate line layer signal line 420 is disposed at substantially the same layer as the gate line 121, e.g., both the data line layer signal line 410 and the data line 121 may be formed from substantially the same material and both the gate line layer signal line 420 and the gate line 121 may be formed from the same material. Here, the additional first contact hole 183b is formed on the connection portion between the transparent connection 192 and the data line layer signal line 410, and the first contact hole 183a is formed on the connection portion between the transparent connection 192 and the gate line layer signal line 420. However, alternative exemplary embodiments include configurations wherein the gate driver 400 may not be formed on the first display panel 100, but may be formed as an additional IC chip, and the first contact holes 183a and 183b for the connection of the transparent connection 192 and the signal lines 410 or 420 may be omitted.

Referring to FIG. 5, a first TFT Q1 and a second TFT Q2 are formed on the peripheral area PA of the LCD, and the first and second TFTs Q1 and Q2 are connected to the data lines 171 and a shorting line 123, and disperse static electricity generated in the display panel 100 to prevent the static electricity from damaging elements such as the TFTs for driving the display apparatus. However, alternative exemplary embodiments include configurations wherein the first TFT Q1 and the second TFT Q2 may be omitted.

The first TFT Q1 includes the shorting line 123 disposed at substantially the same layer as the gate line 121, e.g., the shorting line 123 and the gate line 121 may be formed at substantially the same distance from the insulating substrate 110, a first semiconductor 154a formed on the gate insulating layer 140, a first source electrode 173a formed on the first semiconductor 154a, a first drain electrode 175a formed on the first semiconductor 154a and facing the first source electrode 173a and having a first wide portion 177a, and a first transparent connection 192a electrically connecting the shorting line 123 and the first drain electrode 175a to each other through the first wide portion 177a. In the present exemplary embodiment, the shorting line 123 and the first drain electrode 175a are directly contacted with the first transparent connection 192a, and the first contact holes 183a and 183b are disposed in the contact portion.

The second TFT Q2 includes an expansion 125 of a first gate electrode 124a disposed at substantially the same layer as the gate line 121, a second semiconductor 154b formed on the gate insulating layer 140, the second source electrode 173b formed on the second semiconductor 154b, a second drain electrode 175b facing a second source electrode 173b on the second semiconductor 154b, and a second transparent connection 192b electrically connecting the expansion 125 of the first gate electrode 124a and the data line 171 to each other. Here, the expansion 125 of the first gate electrode 124a and the data line 171 are directly contacted with the second transparent connection 192b, and the first contact holes 183a and 183b are formed in the contact portion.

Also, a portion of the light-blocking member 220 is removed in the portion where the first contact holes 183a and 183b for the interlayer connection of the wiring are disposed. Accordingly, the light-blocking member 220 does not cover the portion of the first contact holes 183a and 183b such that the external light is reflected, thereby deteriorating the display quality of the LCD.

In the exemplary embodiment of the present invention, a first area density of the first contact holes 183a and 183b in the peripheral area PA of the LCD (an area of the first contact holes 183a and 183b per a specific unit area, D1) is equal to or less than about three times a second area density D2 of the second contact hole 185 in the display area DA. Here, the size, number, and positions of the first contact holes 183a and 183b and the second contact hole 185 may be variously designed.

Accordingly, the area density of the first contact holes 183a and 183b for the peripheral area PA of the LCD is reduced compared with the conventional LCD such that reflection of the external light due to the first contact holes 183a and 183b out of the light-blocking member 220 is reduced. Also, if the ratio of the first area density D1 to the second area density D2 is less than about one, the reflection of the external light is further reduced such that the display quality of the LCD is further improved. In other words, the reflection of the external light in the portion interposed between the display area DA and a mold frame of the LCD may be reduced.

Next, the second display panel 200 will be described.

An overcoat (not shown) is formed on a second substrate 210, exemplary embodiments of which may be made of transparent glass, plastic or other similar materials. In one exemplary embodiment, the overcoat may be made of an organic or in inorganic insulating material. Alternative exemplary embodiments include configurations wherein the overcoat may be omitted.

A common electrode 270 is formed on the overcoat. Exemplary embodiments of the common electrode 270 may be made of the transparent conductor, exemplary embodiments of which include ITO and IZO. The common electrode 270 receives a common voltage.

In one exemplary embodiment, an alignment layer may be formed on the common electrode 270.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A thin film transistor array panel comprising:
   a substrate including a display area and a peripheral area;
   a display area signal line disposed in the display area of the substrate;
   a display area thin film transistor disposed in the display area and connected to the display area signal line;
   a plurality of peripheral area signal lines disposed in the peripheral area of the substrate;
   a light-blocking member disposed on the display area signal line, the display area thin film transistor, and the plurality of peripheral area signal lines;
   a transparent connection electrically connecting the plurality of peripheral area signal lines to each other through a plurality of first contact holes penetrating the light-blocking member; and
   a pixel electrode connected to the display area thin film transistor through a second contact hole penetrating the light-blocking member,
   wherein an area density of the first contact hole in the peripheral area is equal to or less than about three times an area density of the second contact hole in the display area.

2. The thin film transistor array panel of claim 1, wherein the pixel electrode is disposed on the light-blocking member.

3. The thin film transistor array panel of claim 2, further comprising
   a peripheral area thin film transistor disposed in the peripheral area of the substrate,
   wherein the plurality of first contact holes includes a contact hole electrically connecting the peripheral area thin film transistor and at least one of the plurality of peripheral area signal lines to each other.

4. The thin film transistor array panel of claim 3, wherein the peripheral area thin film transistor includes a source electrode and a gate electrode, and
   the plurality of first contact holes includes a contact hole electrically connecting the source electrode and the gate electrode of the peripheral area thin film transistor.

5. The thin film transistor array panel of claim 3, wherein the plurality of peripheral area signal lines includes:
   a storage electrode line disposed on the substrate; and
   a storage voltage supplying line disposed on the storage electrode line,
   wherein the plurality of first contact holes includes a contact hole electrically connecting the storage electrode line and the storage voltage supplying line.

6. The thin film transistor array panel of claim 5, wherein the plurality of peripheral area signal lines includes:
   a gate line layer signal line of a gate driver disposed on the substrate; and
   a data line layer signal line of the gate driver disposed on the substrate,
   wherein the plurality of first contact holes includes a contact hole electrically connecting the gate line layer signal line and the data line layer signal line.

7. The thin film transistor array panel of claim 6, further comprising:
   a passivation layer disposed on the display area thin film transistor,
   wherein the second contact hole penetrates the passivation layer.

8. The thin film transistor array panel of claim 2, wherein the plurality of peripheral area signal lines include:
   a storage electrode line disposed on the substrate; and
   a storage voltage supplying line disposed on the storage electrode line,
   wherein the plurality of first contact holes includes a contact hole electrically connecting the storage electrode line and the storage voltage supplying line.

9. The thin film transistor array panel of claim 8, wherein the plurality of peripheral area signal lines include:
   a gate line layer signal line of a gate driver disposed on the substrate; and
   a data line layer signal line of the gate driver disposed on the substrate,
   wherein the plurality of first contact holes includes a contact hole electrically connecting the gate line layer signal line and the data line layer signal line.

10. The thin film transistor array panel of claim 9, further comprising:
    a passivation layer disposed on the display area thin film transistor,
    wherein the second contact hole penetrates the passivation layer.

11. A thin film transistor array panel comprising:
    a substrate including a display area and a peripheral area;
    a display area signal line disposed in the display area of the substrate;
    a display area thin film transistor disposed in the display area and connected to the display area signal line;
    a peripheral area signal line disposed in the peripheral area of the substrate;
    a peripheral area thin film transistor disposed in the peripheral area of the substrate;
    a light-blocking member disposed on the display area signal line, the display area thin film transistor, the peripheral area thin film transistor, and the peripheral area signal line;
    a transparent connection electrically connecting the peripheral area signal line to the peripheral area thin film transistor through a first contact hole penetrating the light-blocking member; and
    a pixel electrode connected to the display area thin film transistor through a second contact hole penetrating the light-blocking member, wherein an area density of the first contact hole in the peripheral area is equal to or less than about three times an area density of the second contact hole in the display area.

12. The thin film transistor array panel of claim 11, wherein:
the peripheral area thin film transistor includes a source electrode and a gate electrode, and
the first contact hole includes a contact hole connecting the source electrode and the gate electrode of the peripheral area thin film transistor.

13. The thin film transistor array panel of claim 12, wherein the pixel electrode is disposed on the light-blocking member.

14. A thin film transistor array panel comprising:
a substrate including a display area and a peripheral area;
a display area signal line disposed in the display area of the substrate;
a display area thin film transistor disposed in the display area and connected to the display area signal line;
a storage electrode line disposed in the peripheral area of the substrate;
a storage voltage supplying line disposed in the peripheral area of the substrate and disposed on the storage electrode line;
a light-blocking member disposed on the display area signal line, the display area thin film transistor, the storage electrode line, and the storage voltage supplying line;
a transparent connection electrically connecting the storage electrode line to the storage voltage supplying line through a first contact hole penetrating the light-blocking member; and
a pixel electrode connected to the display area thin film transistor through a second contact hole penetrating the light-blocking member,
wherein an area density of the first contact hole in the peripheral area is equal to or less than about three times an area density of the second contact hole in the display area.

15. The thin film transistor array panel of claim 14, wherein the pixel electrode is disposed on the light-blocking member.

16. A thin film transistor array panel comprising:
a substrate including a display area and a peripheral area;
a display area signal line disposed in the display area of the substrate;
a display area thin film transistor disposed in the display area and connected to the display area signal line;
a gate driver disposed in the peripheral area of the substrate;
a gate line layer signal line and a data line layer signal line connected to the gate driver;
a light-blocking member disposed on the display area signal line, the display area thin film transistor, the gate line layer signal line, and the data line layer signal line;
a transparent connection electrically connecting the gate line layer signal line to the data line layer signal line through a first contact hole penetrating the light-blocking member; and
a pixel electrode connected to the display area thin film transistor through a second contact hole penetrating the light-blocking member,
wherein an area density of the first contact hole in the peripheral area is equal to or less than about three times an area density of the second contact hole in the display area.

17. The thin film transistor array panel of claim 16, wherein the pixel electrode is disposed on the light-blocking member.

18. A liquid crystal display comprising:
a first display panel including:
a first substrate including a display area and a peripheral area;
a display area thin film transistor disposed in the display area of the first substrate;
a peripheral area signal line disposed in the peripheral area of the first substrate;
a peripheral area thin film transistor disposed in the peripheral area; and
a light-blocking member disposed on the display area thin film transistor, the peripheral area thin film transistor, and the peripheral area signal line;
a second display panel including:
a second substrate facing the first substrate; and
a common electrode disposed on the second substrate;
a liquid crystal layer disposed between the first display panel and the second display panel;
a transparent connection electrically connecting the peripheral area signal line to the peripheral area thin film transistor through a first contact hole penetrating the light-blocking member; and
a pixel electrode connected to the display area thin film transistor through a second contact hole penetrating the light-blocking member,
wherein an area density of the first contact hole in the peripheral area is equal to or less than about three times an area density of the second contact hole in the display area.

19. The liquid crystal display of claim 18, wherein:
the peripheral area thin film transistor includes a source electrode and a gate electrode, and
the first contact hole includes a contact hole connecting the source electrode and the gate electrode of the peripheral area thin film transistor.

20. The liquid crystal display of claim 19, wherein the pixel electrode is disposed on the light-blocking member.

21. A liquid crystal display comprising:
a first display panel including:
a first substrate including a display area and a peripheral area;
a display area thin film transistor disposed in the display area of the first substrate;
a storage electrode line disposed in the peripheral area of the first substrate;
a storage voltage supplying line disposed in the peripheral area and disposed on the storage electrode line; and
a light-blocking member disposed on the display area thin film transistor, the storage electrode line, and the storage voltage supplying line;
a second display panel including:
a second substrate facing the first substrate; and
a common electrode disposed on the second substrate;
a liquid crystal layer disposed between the first display panel and the second display panel;
a transparent connection electrically connecting the storage electrode line to the storage voltage supplying line through a first contact hole penetrating the light-blocking member; and
a pixel electrode connected to the display area thin film transistor through a second contact hole penetrating the light-blocking member, wherein an area density of the first contact hole in the peripheral area is equal to or less than about three times an area density of the second contact hole in the display area.

22. The liquid crystal display of claim 21, wherein the pixel electrode is disposed on the light-blocking member.

23. A liquid crystal display comprising:
a first display panel including:
   a first substrate having a display area and a peripheral area;
   a display area thin film transistor disposed in the display area of the first substrate;
   a gate driver disposed in the peripheral area of the substrate;
   a gate line layer signal line and a data line layer signal line connected to the gate driver; and
   a light-blocking member disposed on the display area signal line, the display area thin film transistor, the gate line layer signal line, and the data line layer signal line;
a second display panel including:
   a second substrate facing the first substrate; and
   a common electrode disposed on the second substrate;
a liquid crystal layer disposed between the first display panel and the second display panel;
a transparent connection electrically connecting the gate line layer signal line to the data line layer signal line through a first contact hole penetrating the light-blocking member; and
a pixel electrode connected to the display area thin film transistor through a second contact hole penetrating the light-blocking member,
wherein an area density of the first contact hole in the peripheral area is equal to or less than about three times an area density of the second contact hole in the display area.

24. The liquid crystal display of claim 23, wherein the pixel electrode is disposed on the light-blocking member.

* * * * *